United States Patent [19]

Beers et al.

[11] Patent Number: 5,312,696
[45] Date of Patent: May 17, 1994

[54] METHOD FOR REDUCING FRETTING WEAR BETWEEN CONTACTING SURFACES

[75] Inventors: Russell A. Beers, West Palm Beach; Michael F. Machinchick, Royal Palm Beach; Allan A. Noetzel, Palm Beach Gardens, all of Fla.

[73] Assignee: United Technologies Corporation, Hartford, Conn.

[21] Appl. No.: 72,666

[22] Filed: Jun. 7, 1993

Related U.S. Application Data

[63] Continuation of Ser. No. 760,318, Sep. 16, 1991, abandoned.

[51] Int. Cl.$^5$ ............................................. F01D 5/30
[52] U.S. Cl. .................................. 428/660; 428/675; 416/241 R; 416/248
[58] Field of Search .................. 428/660, 674, 675; 420/489; 416/241 R, 248; 384/912; 277/236

[56] References Cited

U.S. PATENT DOCUMENTS

| | | | |
|---|---|---|---|
| 2,955,886 | 10/1960 | Fritzlen et al. | 420/489 |
| 2,988,630 | 6/1961 | Moore et al. | 426/675 |
| 2,988,807 | 6/1961 | Boggs | 428/675 |
| 3,993,479 | 11/1976 | Cheskis et al. | 420/489 |
| 4,215,181 | 6/1980 | Betts | 428/594 |
| 4,292,377 | 9/1981 | Peterson et al. | 428/675 |
| 4,330,599 | 5/1982 | Winter et al. | 428/675 |
| 4,401,488 | 8/1983 | Prinz et al. | 428/675 |
| 4,436,790 | 3/1984 | Prinz et al. | 428/675 |
| 4,600,479 | 6/1986 | Thoma et al. | 428/594 |
| 4,980,241 | 12/1990 | Hoffmueller et al. | 428/607 |

FOREIGN PATENT DOCUMENTS

| | | | |
|---|---|---|---|
| 3518021 | 12/1985 | Fed. Rep. of Germany | 428/660 |
| 49-37685 | 10/1974 | Japan | 420/489 |
| 61-109021 | 5/1986 | Japan | 428/660 |
| 389159 | 7/1973 | U.S.S.R. | 420/489 |

*Primary Examiner*—John Zimmerman
*Attorney, Agent, or Firm*—Herbert W. Mylius

[57] ABSTRACT

A method is taught for protecting the surface of a nickel, cobalt, or titanium alloy from fretting wear by coating said surface with a copper-aluminum alloy.

20 Claims, 1 Drawing Sheet

METHOD FOR REDUCING FRETTING WEAR BETWEEN CONTACTING SURFACES

This invention was made under a U.S. Government contract and the Government has rights herein.

This is a continuation of Ser. No. 07/760,318, filed Sep. 16, 1991, now abandoned.

BACKGROUND OF THE INVENTION

1. Field of the Invention

This invention relates to a method for increasing the high temperature fretting wear resistance of many nickel, cobalt, and titanium alloys.

2. Description of the Prior Art

Fretting wear occurs on the mating surfaces of two parts in contact which are designed to be static, but, through transmitted forces such as vibration, oscillate relative to each other with a high frequency, low amplitude motion. Since each surface contains many microscopic asperities in contact, the fretting motion tends to cause local adhesion at these junctions, which may fracture, producing material transfer, wear debris, or both. If the metals in contact are similar, or their constituent elements have good mutual solubilities, the majority of the fretting wear will be adhesive in nature. Elevated temperature will greatly accelerate the process, as may large loads and high frequencies. If the mating surfaces become extremely abraded and gnarled, stress concentrations will result in wear scarring, and a reduction in fatigue strength will result (known specifically as fretting fatigue), causing failure of the part(s). Specific examples of materials subject to fretting wear include turbofan airfoil bladeroots, friction dampers, bearings on shafts with loose fits, and drive-coupling components.

Prior art efforts to overcome the onset of fretting have included providing anti-fretting coatings on the surfaces of the materials in contact. These coatings behave as soft metallic films, keeping the substrate surfaces from coming in contact and dissipating vibrational energy by intracoating shear mechanisms. Such prior art anti-fretting coatings for nickel, cobalt, and titanium alloys have been based on Cu-Ni or Cu-Ni-In compositions. Their success is well documented. However, at temperatures above about 1000° F., accelerated oxidation will rapidly deteriorate the coatings, allowing the substrate surfaces to come in contact and fret.

In addition, conventional application methods rely primarily on thermally spraying the constituents onto the desired part. This has further disadvantages due to the line-of-sight nature of thermal spraying, and the detrimental effects this type of operation has (e.g. warping) on thin-gauge materials.

SUMMARY OF THE INVENTION

In accordance with the method of the present invention, force-transmitting and force-receiving bearing surfaces of nickel, cobalt, and titanium may be protected from fretting wear at temperatures up to 1200° F. or higher by coating either one or both of the surfaces with a coating of an alloy of copper. Preferably, the copper alloy comprises about 92 weight percent copper, and about 8 weight percent aluminum. Alternatively, the alloy may comprise copper, from about 4 to about 8 percent aluminum, and up to about 4 percent silicon. Additions of other elements, such as up to about 5 weight percent iron, or nickel, may provide successful results at temperatures up to about 1000° F., but generally not at the higher temperatures achieved using the above-identified alloys, as these additional elements usually degrade high temperature oxidation resistance.

The thickness of the coating may be within the range of from 0.1 to about 4.0 mils, and preferably within the range of from about 0.75 to about 1.5 mils.

The coating may be applied by typical physical vapor deposition techniques. Cathodic arc deposition is the preferred method, although other forms of ion vapor deposition are suitable.

DESCRIPTION OF THE PREFERRED EMBODIMENTS

Figure 1:
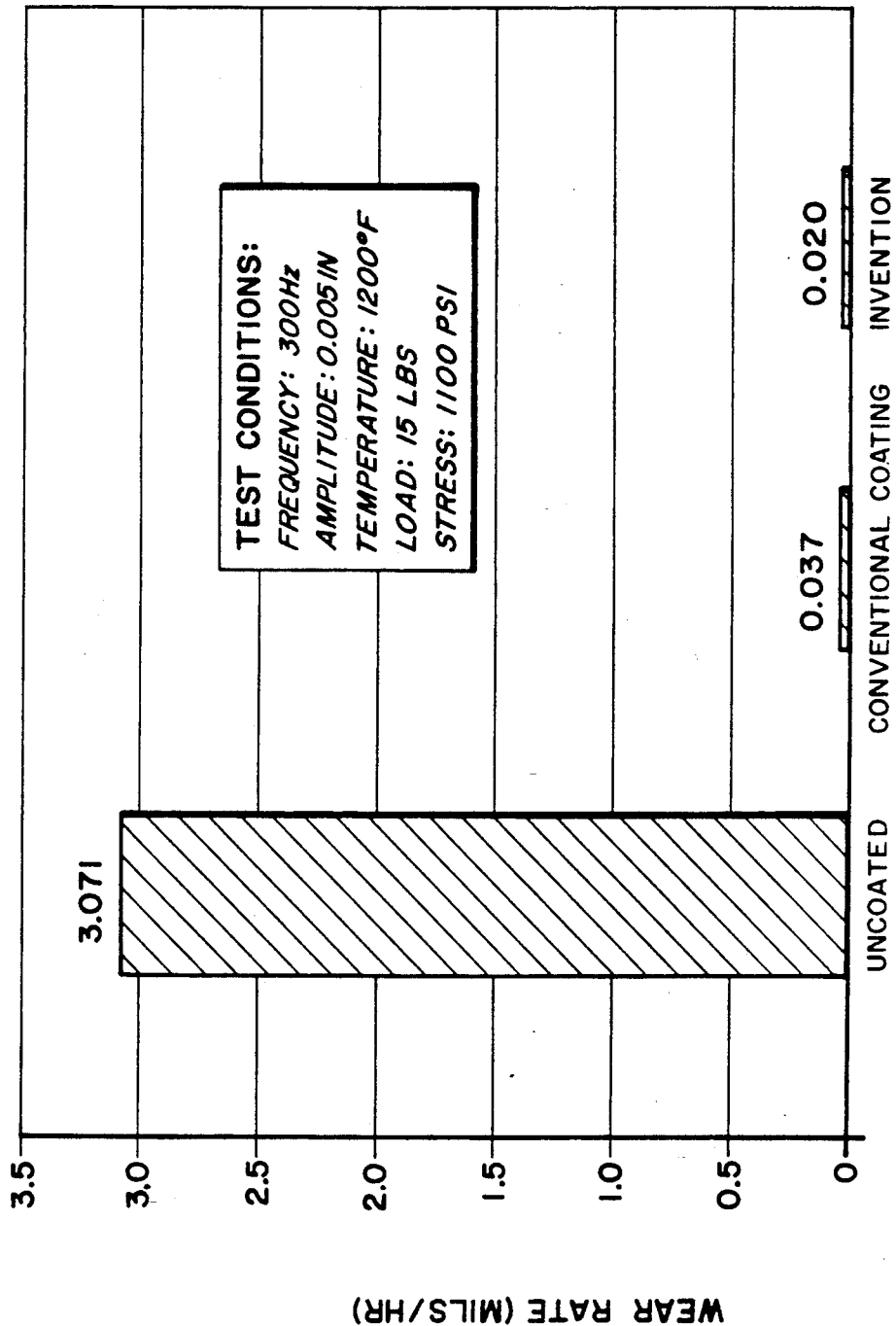
FIG. 1 shows comparative results of fretting tests conducted on an uncoated nickel substrate, the same substrate having a conventional anti-fretting coating, and the same substrate having the anti-fretting coating of this invention.

It has been determined that coating a thin nickel or nickel alloy work-piece in accordance with the present invention yields a significant improvement in durability as opposed to uncoated work-pieces at temperatures up to at least 1200° F. The coating of the invention finds particular utility with such parts as compressor airfoil roots, but can be applied with beneficial effect to any nickel or nickel alloy surface where fretting wear is a problem, such as blade and vane airfoil damping systems. The anti-fretting coating is also beneficial for cobalt and titanium alloy surfaces.

Since the coating, in accordance with the invention, is beneficial at temperatures up to approximately 1250° F., it has been found to provide advantages over conventional methods of minimizing fretting wear, which include the use of dry film lubricants and coatings of alloys, such as copper-nickel, and copper-nickel-indium, or silver plating. Such conventional coatings are deficient in being effective only at temperatures up to about 1000° F., which temperature is below the temperature encountered in many applications where fretting is a problem, such as in modern jet engines.

With the coating of the present invention, it has been found that the copper and aluminum contents, particularly in the presence of silicon, minimize oxidation of the contact surfaces in the high-temperature environments encountered during use of the coated nickel-base alloy surfaces. This results in retention of the protective properties of the coating at temperatures exceeding 1000° F., at which temperatures conventional coatings are rendered ineffective. By retaining oxidation resistant properties at these elevated temperatures, resistance against fretting is maintained in applications of nickel-based alloys for which conventional coating practices are not effective.

In accordance with the method of the invention, test specimens of a nickel-base alloy corresponding to AMS 5544, of the composition, in weight percent, Ni-19.5 Cr-13.5 Co-4.2 Mo-3Ti-1.4 Al-0.08 Zr-0.05C, were coated by ion vapor deposition coating. Coating was performed in a conventional low pressure inert gas vapor deposition chamber to deposit a coating thickness of 1.25 mils of an alloy comprising, in weight percent, Cu-7.5 Al. Test specimens prepared as above were tested in spring form on an oscillating spring-on-plate wear test facility, using plate specimens of alloy AMS 5596 as the contacting surface. Test springs of uncoated AMS 5544 and AMS 5544 coated with a conventional anti-fretting coating of 62 percent copper, 38 percent nickel were prepared and tested simultaneously for comparative results. Two springs of each specimen of 0.015 inch thickness and containing a 0.050 inch contact radius were loaded against two uncoated plates of 0.125 inch thickness, with a load of 15 pounds, producing a maximum contact pressure of 1100 psi. The springs were held rigid in the vertical plane while the plates were oscillated by an electromagnetic shaker at a frequency of 300 Hz and amplitude of 0.005 inches. The entire fixture was surrounded by a resistant-element furnace producing a temperature of 1200° F. Thickness measurements were made on the spring and plate specimens at 2-hour intervals, and the test proceeded for either 10 hours or failure, whichever came first. As shown in FIG. 1, the coating of the present invention greatly reduced the fretting wear rate of the nickel substrate, as compared to the uncoated substrate and the conventional anti-fretting coating. Similar results are obtained when nickel, cobalt, and titanium substrates are tested using anti-fretting coatings of Cu-8Al, and Cu, 4-8 Al, 0-4 Si.

It is to be understood that the above description of the invention is subject to considerable modification, change, and adaptation by those skilled in the art, and that such modifications, changes, and adaptations, are intended to be considered within the scope of the present invention, which is set forth by the claims which follow.

What is claimed is:

1. A method for reducing fretting wear between contacting surfaces at a temperature from about 1000° F. to about 1250° F., said method comprising applying to at least one of said contacting surfaces a coating consisting essentially of from about 88 to about 96 weight percent copper, from about 4 to about 8 weight percent aluminum, and from 0 to about 4 weight percent silicon, placing said surfaces in contact, and causing relative movement between said surfaces at said temperature.

2. The method of claim 1, wherein said contacting surfaces are of a metal selected from the group consisting of nickel, cobalt, and titanium alloys.

3. The method of claim 2, wherein said coating is deposited by physical vapor deposition, and is from about 0.1 to about 4 mils thick.

4. The method of claim 3, wherein said coating is from about 0.75 to about 1.5 mils thick.

5. The method of claim 4, wherein the surface is a nickel-base alloy.

6. The method of claim 5, wherein said coating consists essentially of about 92 weight percent copper and about 8 weight percent aluminum.

7. The method of claim 6, wherein said coating is applied by cathodic arc deposition.

8. The method of claim 7, wherein said coating comprises about 92.5 weight percent copper and about 7.5 weight percent aluminum.

9. A method for transmitting forces between contacting components of a jet engine, said method comprising applying to the contacting surfaces of said components an anti-fretting coating consisting essentially of from about 88 to about 96 weight percent copper, from about 4 to about 8 weight percent aluminum, and from 0 to about 4 weight percent silicon, placing said coated surfaces in contact, and applying a force to one of said components at a temperature of from about 1000° F. to about 1250° F.

10. The method of claim 9, wherein said contacting components are of a metal selected from the group consisting of nickel, cobalt, and titanium alloys.

11. The method of claim 10, wherein said coating is deposited by physical vapor deposition, and is from about 0.1 to about 4 mils thick.

12. The method of claim 11, wherein said coating is from about 0.75 to about 1.5 mils thick.

13. The method of claim 12, wherein said component is a nickel-base alloy.

14. The method of claim 13, wherein said coating consists essentially of about 92 weight percent copper and about 8 weight percent aluminum.

15. The method of claim 12, wherein said coating consists essentially of 92.5 weight percent copper and about 7.5 weight percent aluminum.

16. A fretting-fatigue resistant compressor airfoil root for use at a temperature of from about 1000° F. to about 1250° F., comprising an airfoil root of a metal selected from the group consisting of nickel, cobalt, and titanium alloys, the surface thereof having a coating of an alloy consisting essentially of from about 88 to about 96 weight percent copper, from about 4 to about 8 weight percent aluminum, and from 0 to about 4 weight percent silicon, said coating being from about 0.1 to about 4 mils thick.

17. The airfoil root of claim 16, wherein said root is a nickel base alloy, and said coating consists essentially of about 92 weight percent copper and about 8 weight percent aluminum.

18. The airfoil root of claim 17, wherein said coating is from about 0.75 to about 1.5 mils thick.

19. The airfoil root of claim 16, wherein said coating consists essentially of about 92.5 weight percent copper and about 7.5 weight percent aluminum.

20. The airfoil root of claim 19, wherein said root comprises a nickel base alloy, and said coating is from about 0.75 to about 1.5 mils thick.

* * * * *

UNITED STATES PATENT AND TRADEMARK OFFICE
CERTIFICATE OF CORRECTION

PATENT NO. : 5,312,696
DATED : May 17, 1994
INVENTOR(S) : Russell A. Beers et al It is certified that error appears in the above-identified patent and that said Letters Patent is hereby corrected as shown below:

Col. 4, line 29, claim 15, change "12" to --13--

Signed and Sealed this

Sixth Day of September, 1994

Attest:

BRUCE LEHMAN

Attesting Officer

Commissioner of Patents and Trademarks